United States Patent
Savransky

(10) Patent No.: US 8,164,949 B2
(45) Date of Patent: Apr. 24, 2012

(54) REDUCING DRIFT IN CHALCOGENIDE DEVICES

(75) Inventor: Semyon D. Savransky, Newark, CA (US)

(73) Assignee: Ovonyx, Inc., Troy, MI (US)

( * ) Notice: Subject to any disclaimer, the term of this patent is extended or adjusted under 35 U.S.C. 154(b) by 0 days.

(21) Appl. No.: 13/072,002

(22) Filed: Mar. 25, 2011

(65) Prior Publication Data

US 2011/0168965 A1 Jul. 14, 2011

Related U.S. Application Data

(62) Division of application No. 12/082,070, filed on Apr. 8, 2008, now Pat. No. 7,936,593.

(51) Int. Cl.
*G11C 11/00* (2006.01)
*H01L 47/00* (2006.01)

(52) U.S. Cl. ......... 365/163; 257/2; 257/4; 257/E31.029; 257/E45.002; 438/102

(58) Field of Classification Search ............ 365/163; 438/102; 257/2, 4, E31.029, E45.002
See application file for complete search history.

(56) References Cited

U.S. PATENT DOCUMENTS

2006/0097240 A1* 5/2006 Lowrey et al. ............ 257/5
2008/0246016 A1* 10/2008 Kakoschke et al. ......... 257/5
2009/0034325 A1* 2/2009 Lowrey et al. ............ 365/163
2009/0316492 A1* 12/2009 Widjaja .................. 365/189.2

* cited by examiner

*Primary Examiner* — Ly D Pham
(74) *Attorney, Agent, or Firm* — Trop, Pruner & Hu, P.C.

(57) ABSTRACT

Chalcogenide materials conventionally used in chalcogenide memory devices and ovonic threshold switches may exhibit a tendency called drift, wherein threshold voltage or resistance changes with time. By providing a compensating material which exhibits an opposing tendency, the drift may be compensated. The compensating material may be mixed into a chalcogenide, may be layered with chalcogenide, may be provided with a heater, or may be provided as part of an electrode in some embodiments. Both chalcogenide and non-chalcogenide compensating materials may be used.

19 Claims, 3 Drawing Sheets

REDUCING DRIFT IN CHALCOGENIDE DEVICES

CROSS-REFERENCE TO RELATED APPLICATIONS

This application is a divisional of U.S. patent application Ser. No. 12/082,070, filed on Apr. 8, 2008 now U.S. Pat. No. 7,936,593.

BACKGROUND

This relates generally to chalcogenide devices such as phase change memories and threshold switches.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

Chalcogenide devices are commonly subject to drift in the reset or amorphous state. The resistance and threshold voltage of chalcogenide materials commonly used for ovonic unified memories or ovonic threshold switches, increases with time in the reset state. This behavior is intrinsic for many amorphous semiconductors used in phase change memories or threshold switching cells. Examples of materials whose threshold voltage drifts higher include $Ge_2Sb_2Te_5$ ($Ge_{22}Sb_{22}Te_{56}$) or $Ge_1Sb_2Te_4$, used for ovonic unified memories and $Ge_6Si_{26}As_{32}Te_{36}$ or $Ga_{12}Ge_{6.5}Si_{6.5}As_{25}Te_{50}$, used for ovonic threshold switches.

The electrical drift may be induced by the passage of time or exposure to temperature. Electrical drift is generally manifested as an increase in threshold voltage or an increase in resistance with time.

Some chalcogenide and non-chalcogenide materials exhibit the opposite drift, namely, they exhibit a decrease in either resistance or threshold voltage. Generally these oppositely drifting materials are not materials that are commonly used for either phase change memories or ovonic threshold switches. By combining these drift compensating materials with materials traditionally used in phase change memories or ovonic threshold switches, drift may be reduced or even eliminated, in some cases.

In some embodiments, the drift compensating material is advantageously placed in contact with the material to be compensated. This may be done by using the drift compensating material as a surface coating on the material to be treated, using the drift compensating chalcogenide as an electrode in the case of conductive drift compensating materials, or by intermixing the drift compensating material into the material being treated.

There are two types of drift compensating materials. One type has a threshold voltage that decreases with time. Another type of drift compensating material has a resistance that decreases with time. Examples of a threshold voltage drift compensating chalcogenide materials include $Si_{12}((As_2Se_3)Ge_{20})$ and In—Se. Resistance decreases over time in some conductive non-chalcogenide materials with mixed electron and ion conductivity, such as $Li_2O:3B_2O_3$—$LiClO_4$ composite. The composite is not a chalcogenide, but, rather, is a solid electrolyte. See Quartarone et al., "Long-term stability of PEO—$Li_2O:3B_2O_3$—$LiClO_4$ composite solid electrolyte," Electrochimica Acta, Vol. 43, Issues 10-11 (1998)(pages 1321-1325).

An atomic diffusion barrier layer can be used to avoid contaminating active compensated chalcogenide with drift compensating material. Advantageously, the barrier is compatible with the chalcogenide material.

Figure 1:
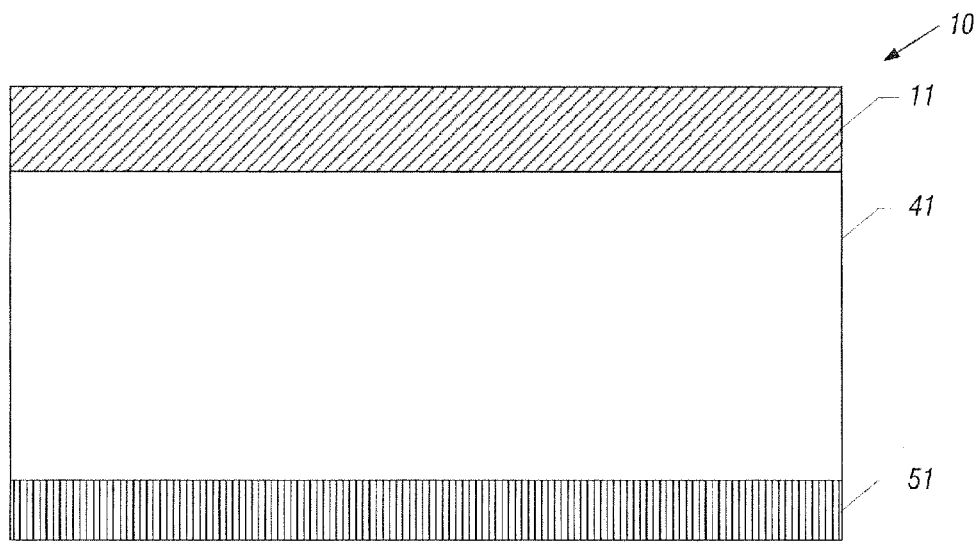
FIG. 1 is an enlarged, cross-sectional view of one embodiment of the present invention.

Referring to FIG. 1, a phase change memory 10 may include a bottom electrode 51, a thicker top electrode 11, and a phase change or threshold switch material 41. In one embodiment, the top and bottom electrodes 11 and 51 use conventional conductive electrode materials and the material 41 has drift compensating material intermixed with it.

In another embodiment, the electrodes 51 and 11 may include conductive drift compensating materials. An example of a conductive drift compensating material is $Li_2O:3B_2O_3$—$LiClO_4$ composite.

Figure 2:
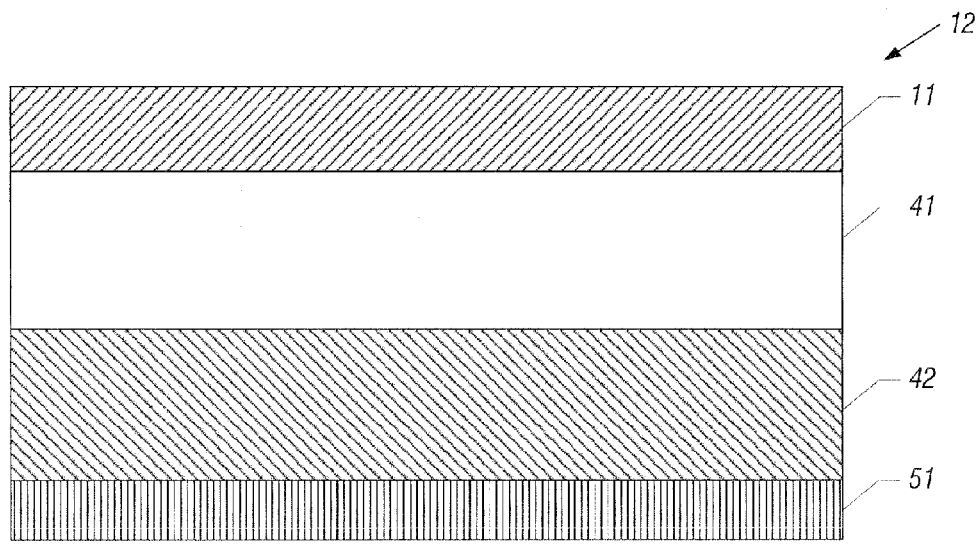
FIG. 2 is an enlarged, cross-sectional view of another embodiment of the present invention.

Referring to FIG. 2, a bottom electrode 51 and a top electrode 11 may sandwich a chalcogenide material 41 to be compensated and a compensating material 42. The materials 41 and 42 may be switched as well. The bottom electrode 51 may, for example, be made of carbon, metal, or a compound like titanium silicon nitride that can be confined for phase change material cells. The material 41 may be a phase change material for non-volatile memory, such as $Ge_{22}Sb_{22}Te_{56}$, or a threshold switching material for switching devices, such as $Ga_{12}Ge_{6.5}Si_{6.5}As_{25}Te_{50}$. The compensating material 42 may be drift compensating material such as lithium-based composites. A top electrode 11 may be made of carbon, metal, drift compensating material or a compound like titanium silicon nitride.

Figure 3:
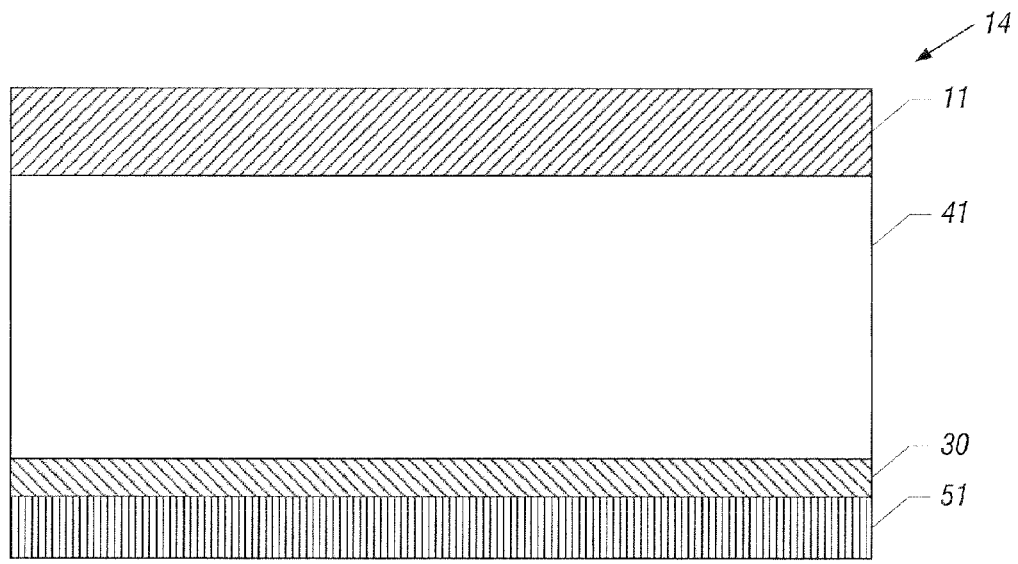
FIG. 3 is an enlarged, cross-sectional view of another embodiment of the present invention.

Referring to FIG. 3, a four layer cell may include an atomic diffusion barrier 30. The layer 30 may be titanium aluminum nitride in one embodiment. The first electrode 11 may be a conductive drift compensating material. The layer 41 may be a phase change material or a threshold switching material. The layer 51 may be a second electrode made of conductive drift compensating material. Again, suitable drift compensating materials have already been described.

Figure 4:
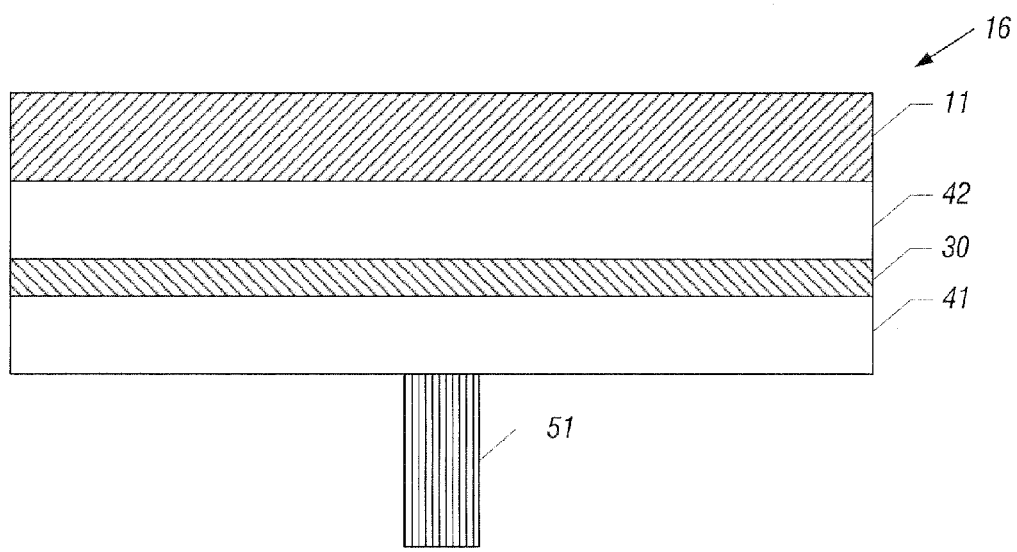
FIG. 4 is an enlarged, cross-sectional view of still another embodiment of the present invention.

A five layer structure, shown in FIG. 4, includes a bottom electrode 51 which, in one embodiment, may be a heater (e.g. titanium silicon nitride). A top electrode 11 is situated over a drift compensating material 42 which need not be conductive.

An atomic diffusion barrier 30 may be positioned over the phase change material or threshold switching material 41.

Figure 5:
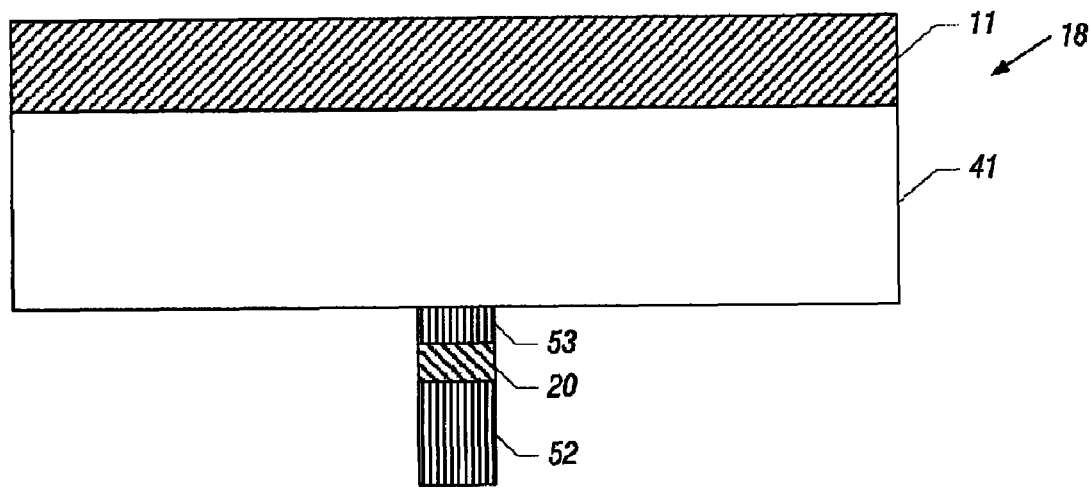
FIG. 5 is an enlarged, cross-sectional view of yet another embodiment of the present invention.

Referring to FIG. 5, a cell with drift compensating material 20, embedded into the bottom electrode 52 or 53, may include a drift compensating material. A phase change or threshold switching material 41 may be located under the top electrode 11.

Drift compensation may be used with phase change memory devices whose operation is based on changing between high and low resistivity states, such as the reset and set states or states of intermediate resistivity. Drift compensation is also applicable to known threshold switching devices, including those with one energy independent high resistivity off state and another energy dependent low resistivity on state. Drift compensation may also be used for phase change memories with selection devices (such as an ovonic threshold switch) due to the serial connection of the phase change or ovonic threshold switch material with parameters drifting up and electrode material with parameters drifting down (or vice versa). Alternatively, combined ovonic unified memory and ovonic threshold switching cells can be drift compensated due to serial connection of the ovonic unified memory and ovonic threshold switch materials with materials having opposite drift behavior. Also, drift compensation of multilayer ovonic unified memory devices can be achieved by including differing phase-change compositions having opposite drift behavior within the stack of layers.

A phase change material may be programmed to a certain reset resistance value so that its drift can be fully or partially compensated. In order to nullify or reduce threshold voltage drift, materials with opposite drifts may be combined into one phase change material.

In order to nullify or reduce the total drift, a chalcogenide material with a threshold voltage drifting down, such as indium selenium, may be used to compensate a phase change memory material whose threshold voltage drifts up, such as indium antimony telluride or germanium antimony telluride in an ovonic unified memory in series with an ovonic threshold switch.

Programming to alter the state or phase of the material may be accomplished by applying voltage potentials to the electrodes 11 and 51 (or 52), thereby generating a voltage potential across a memory element including a phase change material 41. When the voltage potential is greater than the threshold voltages of any select device and memory element, then an electrical current may flow through the phase change material 41 in response to the applied voltage potentials, and may result in heating of the phase change material 41.

This heating may alter the memory state or phase of the material 41, in one embodiment. Altering the phase or state of the material 41 may alter the electrical characteristic of memory material, e.g., the resistance or threshold voltage of the material may be altered by altering the phase of the memory material. Memory material may also be referred to as a programmable resistance material.

In the "reset" state, memory material may be in an amorphous or semi-amorphous state and in the "set" state, memory material may be in an a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to melt and then quenched to vitrify and "reset" memory material in an amorphous state (e.g., program memory material to a logic "0" value). Heating the volume of memory material to a relatively lower crystallization temperature may crystallize or devitrify memory material and "set" memory material (e.g., program memory material to a logic "1" value). Various resistances of memory material may be achieved to store information by varying the amount of current flow and duration through the volume of memory material.

One or more MOS or bipolar transistors or one or more diodes (either MOS or bipolar) may be used as the select device. If a diode is used, the bit may be selected by lowering the row line from a higher deselect level. As a further non-limiting example, if an n-channel MOS transistor is used as a select device with its source, for example, at ground, the row line may be raised to select the memory element connected between the drain of the MOS transistor and the column line. When a single MOS or single bipolar transistor is used as the select device, a control voltage level may be used on a "row line" to turn the select device on and off to access the memory element.

An ovonic threshold switch is either on or off depending on the amount of voltage potential applied across the switch and, more particularly, whether the current through the switch exceeds its threshold current or voltage, which then triggers the device into an on state. The off state may be substantially electrically non-conductive and the on state may be a substantially conductive state with less resistance than the off state.

In the on state, the voltage across the switch, in one embodiment, is equal to its holding voltage $V_{hold}+IR_{on}$, where $R_{on}$ is the dynamic resistance from the extrapolated X axis intercept $V_{hold}$. For example, an ovonic threshold switch may have a threshold voltage $V_{th}$ and, if a voltage potential less than the threshold voltage of the switch is applied across the switch, then the switch may remain off or in a relatively high resistance state so that little or no electrical current passes.

Alternatively, if a voltage potential greater than the threshold voltage of the select device is applied across the device, then the device may turn on, i.e., operate in a relatively low resistance state so that significant electrical current passes through the switch. In other words, one or more series connected switches may be in a substantially electrically non-conductive state at less than a predetermined voltage, e.g., the threshold voltage as applied across a switch. The switch may be in a substantially conductive state if greater than a predetermined voltage is applied across the switch.

In one embodiment, each switch may comprise a switch material that is a chalcogenide alloy. The switch material may be a material in a substantial amorphous state positioned between two electrodes that may be repeatedly and reversibly switched between a higher resistance off state that is generally greater than about 1 megaOhms and a relatively lower resistance on state that is generally less than about 1000 Ohms in series with the holding voltage by the application of electrical current or potential.

Each switch is a two-terminal device that has an IV curve similar to that of a phase change memory element that is in an amorphous state. However, unlike a phase change memory element, the ovonic threshold switch does not change phase. That is, the switching material of the ovonic threshold switch is not a phase programmable material and, as a result, the switch may not be a memory device capable of storing information. For example, the switching material may remain permanently amorphous and the IV characteristics may remain the same throughout the operating life.

In the low voltage, low electric field mode, where the voltage applied across the switch is less than the threshold voltage $V_{th}$, the switch may be off or non-conducting and exhibits a relatively high resistance. The switch may remain in the off state until a sufficient voltage, namely, the threshold voltage, is applied or a sufficient current is applied, namely, the threshold current, that switches the device to a conductive relatively low resistance on state. After a voltage potential of greater than about the threshold voltage is applied across the device, the voltage potential across the device may drop or snapback to a holding voltage $V_{hold}$. Snapback may refer to the voltage difference between the threshold voltage and the holding voltage of the switch.

In the on state, the voltage potential across the switch may remain close to the holding voltage as current passing through the switch is increased. The switch may remain on until the current through the switch drops below a holding current. Below this value, the switch may turn off and return to a relatively high resistance, non-conductive off state, until the threshold voltage and current are again exceeded.

In some embodiments, only one switch may be used. In other embodiments, two or more series connected switches may be used.

Figure 6:
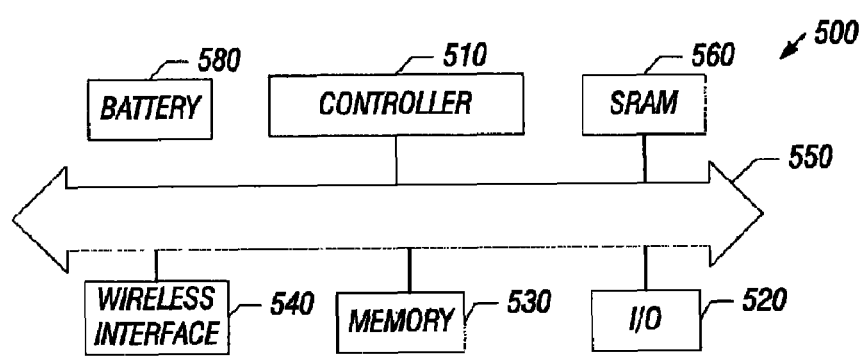
FIG. 6 is a system depiction for one embodiment of the present invention.

Turning to FIG. 6, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a first material having a first variation of an electrical characteristic with time; and
   a second material in electrical series with said first material, said second material having a second variation of said electrical characteristic with time, said second variation counteracting said first variation, and said second material mixed with said first material.

2. The apparatus of claim 1, wherein said first material is a programmable resistance material or an electrical switching material.

3. The apparatus of claim 2, wherein said second material is a conductive material.

4. The apparatus of claim 3, wherein said second material is an electrode.

5. The apparatus of claim 2, wherein said second material is a programmable resistance material or an electrical switching material.

6. The apparatus of claim 2, wherein said first material comprises a chalcogen element.

7. The apparatus of claim 2, wherein said first material comprises a phase change material.

8. The apparatus of claim 1, wherein said electrical characteristic is resistivity or threshold voltage.

9. The apparatus of claim 1, wherein said first material and said second material form separate layers.

10. The apparatus of claim 1, wherein said second material is interspersed within said first material.

11. The apparatus of claim 1, wherein said second material comprises an oxide.

12. The apparatus of claim 1, wherein said first variation is spontaneous.

13. The apparatus of claim 1, further comprising a barrier layer interposed between said first material and said second material.

14. The method of claim 13, wherein said barrier layer comprises a conductive material.

15. The apparatus of claim 1, further comprising a first electrode in electrical series with said first material and a second electrode in electrical series with said second material.

16. A method for forming the apparatus of claim 1 comprising:
   combining said first material and said second material.

17. The method of claim 16, wherein said second material is layered over said first material.

18. An apparatus comprising:
   a first material having a first variation of an electrical characteristic with time;
   a second material in electrical series with said first material, said second material having a second variation of said electrical characteristic with time, said second variation counteracting said first variation; and
   a barrier layer interposed between said first material and said second material.

19. The apparatus of claim 18, wherein said barrier layer comprises a conductive material.

* * * * *